United States Patent
Yamazaki et al.

(10) Patent No.: US 10,763,122 B2
(45) Date of Patent: Sep. 1, 2020

(54) METHOD OF MANUFACTURING SEMICONDUCTOR DEVICE AND ETCHING MASK

(71) Applicant: TOSHIBA MEMORY CORPORATION, Minato-ku, Tokyo (JP)

(72) Inventors: Soichi Yamazaki, Yokkaichi Mie (JP); Kazuhito Furumoto, Yokkaichi Mie (JP); Kosuke Horibe, Yokkaichi Mie (JP); Keisuke Kikutani, Yokkaichi Mie (JP); Atsuko Sakata, Yokkaichi Mie (JP); Junichi Wada, Yokkaichi Mie (JP); Toshiyuki Sasaki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/695,918

(22) Filed: Sep. 5, 2017

(65) Prior Publication Data

US 2018/0261466 A1 Sep. 13, 2018

(30) Foreign Application Priority Data

Mar. 10, 2017 (JP) ................................. 2017-046391

(51) Int. Cl.
| | |
|---|---|
| *H01L 21/311* | (2006.01) |
| *H01L 21/3213* | (2006.01) |
| *H01L 21/033* | (2006.01) |
| *H01L 27/11582* | (2017.01) |
| *H01L 27/1157* | (2017.01) |

(52) U.S. Cl.
CPC .... *H01L 21/31144* (2013.01); *H01L 21/0332* (2013.01); *H01L 21/31116* (2013.01); *H01L 21/32136* (2013.01); *H01L 21/32139* (2013.01); *H01L 27/1157* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 4,344,816 A | * | 8/1982 | Craighead | C23F 4/00 204/192.32 |
| 5,607,599 A | * | 3/1997 | Ichihara | B82Y 10/00 216/22 |

(Continued)

FOREIGN PATENT DOCUMENTS

| | | |
|---|---|---|
| JP | H227713 A | 1/1990 |
| JP | H430433 A | 2/1992 |

(Continued)

*Primary Examiner* — Allan W. Olsen
(74) *Attorney, Agent, or Firm* — Foley & Lardner LLP

(57) ABSTRACT

A method of manufacturing a semiconductor device includes forming a mask layer including aluminum or an aluminum compound on a layer to be etched comprising at least one first metal selected from tungsten, tantalum, zirconium, hafnium, molybdenum, niobium, ruthenium, osmium, rhenium, and iridium. The method of manufacturing a semiconductor device further includes patterning the mask layer, and etching the layer to be etched by using the patterned mask layer to form a hole or a groove in the layer to be etched.

16 Claims, 14 Drawing Sheets

(56) References Cited

U.S. PATENT DOCUMENTS

| | | | | |
|---|---|---|---|---|
| 5,614,795 A * | 3/1997 | Kim | H01J 1/3042 | 313/309 |
| 5,662,815 A * | 9/1997 | Kim | H01J 1/3042 | 216/11 |
| 5,667,700 A * | 9/1997 | Rudigier | G03F 7/0005 | 216/12 |
| 5,872,693 A * | 2/1999 | Yoda | G11B 5/3113 | 360/123.26 |
| 6,143,191 A * | 11/2000 | Baum | C23F 1/12 | 216/63 |
| 6,198,597 B1 * | 3/2001 | Tateyama | G11B 5/3113 | 360/122 |
| 6,429,058 B1 * | 8/2002 | Colgan | H01L 27/1288 | 438/158 |
| 7,015,497 B1 * | 3/2006 | Berger | B82Y 10/00 | 257/14 |
| 8,206,602 B2 * | 6/2012 | Kimura | C23F 4/00 | 216/22 |
| 8,563,431 B2 * | 10/2013 | Miyairi | H01L 21/311 | 438/671 |
| 9,070,869 B2 * | 6/2015 | Jung | H01L 27/222 | |
| 2001/0034106 A1 * | 10/2001 | Moise | H01L 21/31122 | 438/396 |
| 2002/0072223 A1 * | 6/2002 | Gilbert | H01L 21/32051 | 438/629 |
| 2002/0101129 A1 * | 8/2002 | Grade | B81B 3/0051 | 310/309 |
| 2002/0164843 A1 * | 11/2002 | Yamazaki | H01L 27/12 | 438/166 |
| 2002/0177281 A1 * | 11/2002 | Amemiya | G02F 1/1345 | 438/300 |
| 2004/0185669 A1 * | 9/2004 | Li | H01L 21/31116 | 438/704 |
| 2005/0095867 A1 * | 5/2005 | Shimada | C23F 4/00 | 438/720 |
| 2005/0280110 A1 * | 12/2005 | Nichols | H01L 27/14623 | 257/458 |
| 2006/0012000 A1 * | 1/2006 | Estes | B82Y 10/00 | 257/425 |
| 2007/0026682 A1 * | 2/2007 | Hochberg | C23F 4/00 | 438/710 |
| 2007/0281479 A1 * | 12/2007 | Lee | H01L 21/28273 | 438/689 |
| 2009/0023296 A1 | 1/2009 | Nishizuka | | |
| 2012/0103933 A1 | 5/2012 | Yamada et al. | | |
| 2012/0291275 A1 * | 11/2012 | Rha | H05K 3/107 | 29/846 |
| 2013/0065083 A1 * | 3/2013 | Takizawa | G11B 5/855 | 428/800 |
| 2013/0216864 A1 * | 8/2013 | Takizawa | G11B 5/855 | 428/834 |
| 2015/0104882 A1 * | 4/2015 | Jung | H01L 43/12 | 438/3 |
| 2015/0276651 A1 * | 10/2015 | Petisce | G01N 27/3272 | 204/403.1 |
| 2015/0310885 A1 * | 10/2015 | Kimura | G11B 5/855 | 216/22 |
| 2016/0365249 A1 | 12/2016 | Nakao et al. | | |

FOREIGN PATENT DOCUMENTS

| | | |
|---|---|---|
| JP | H0430433 A | 2/1992 |
| JP | 2007-250570 A | 9/2007 |
| JP | 2012-099589 A | 5/2012 |
| JP | 2017-005178 A | 1/2017 |

* cited by examiner

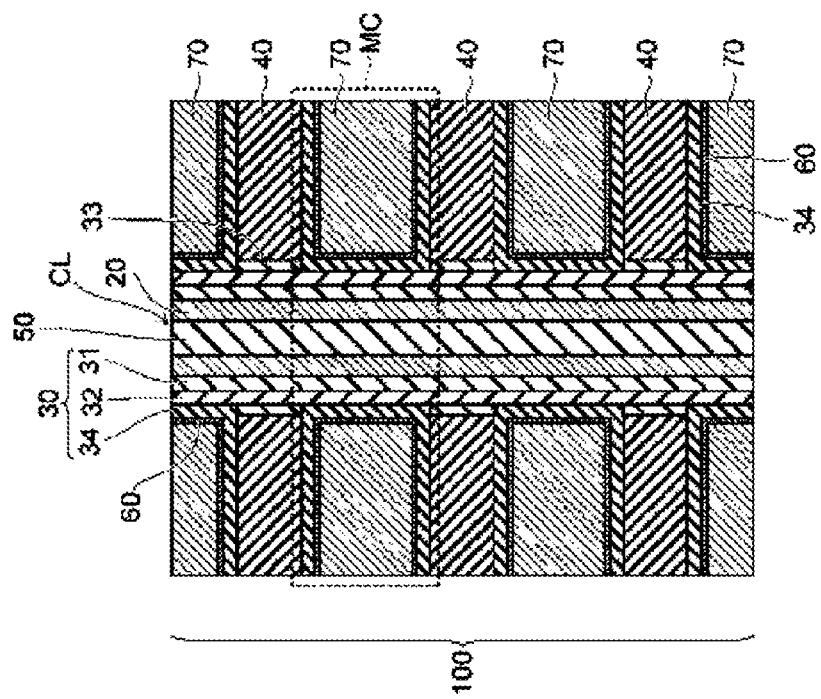
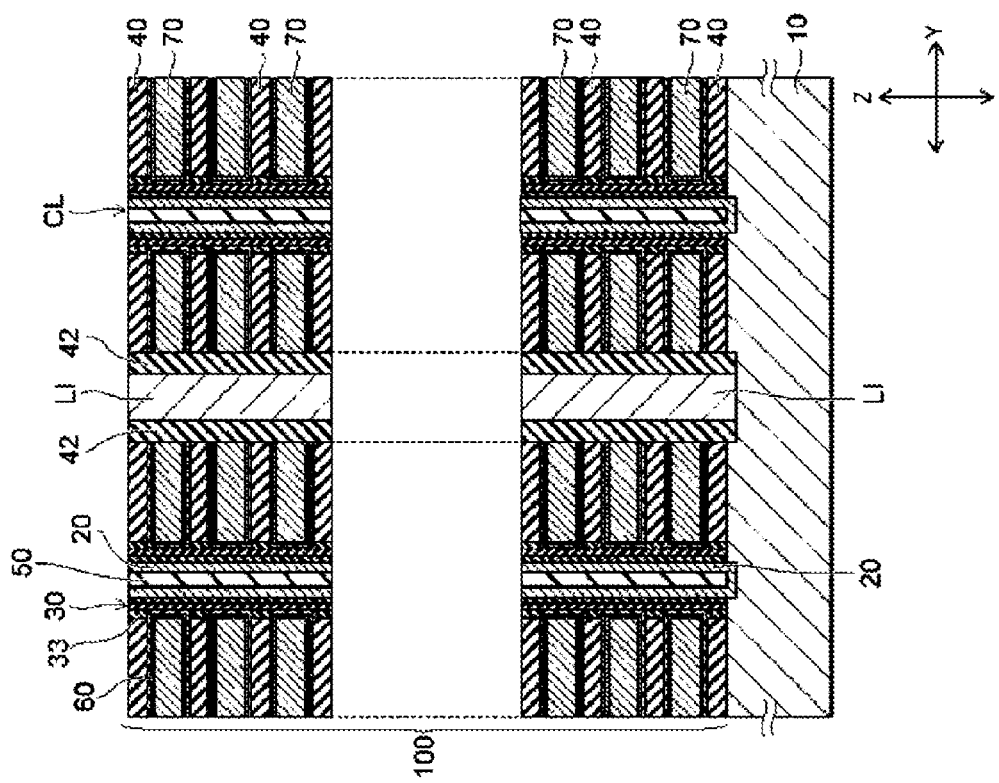

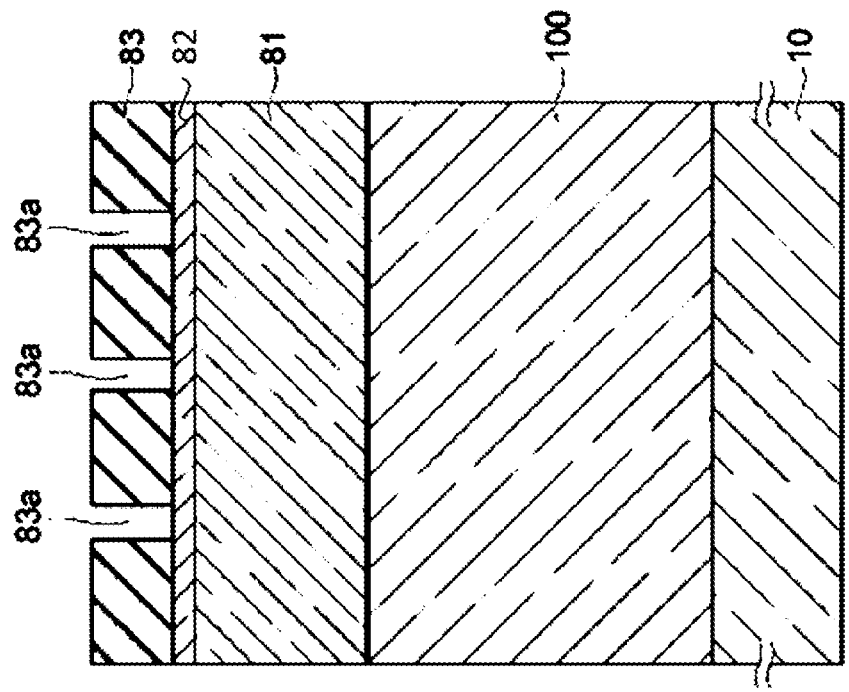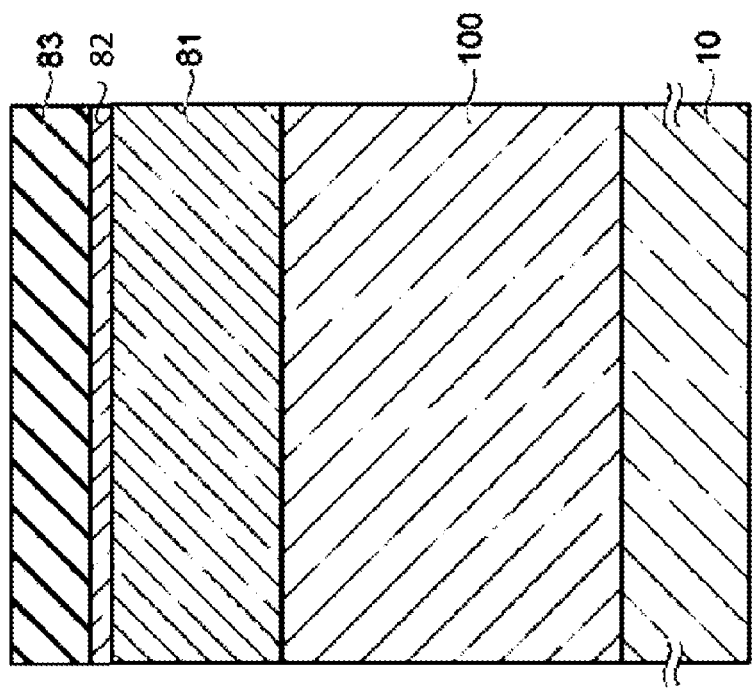

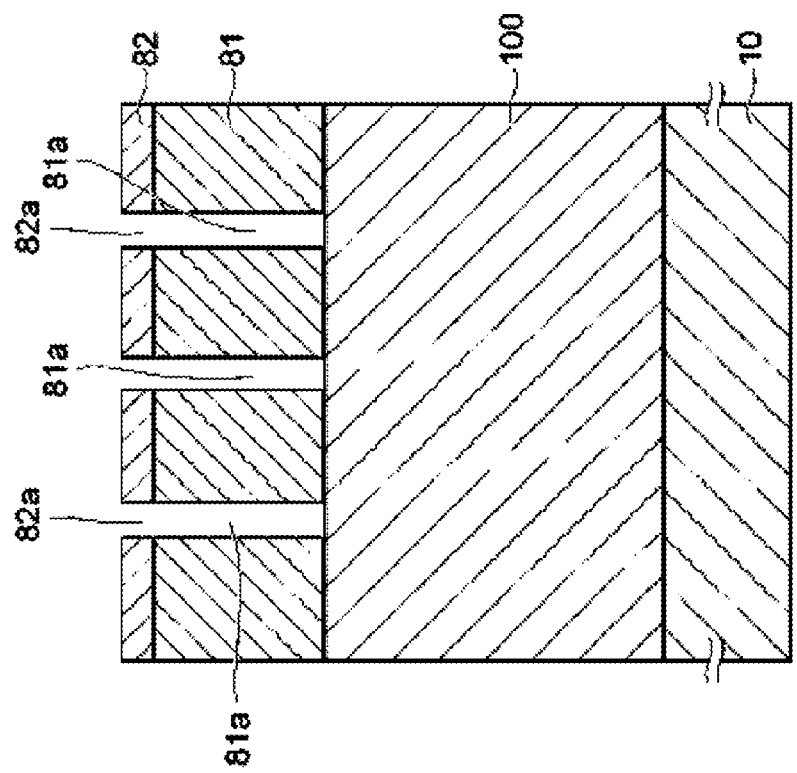
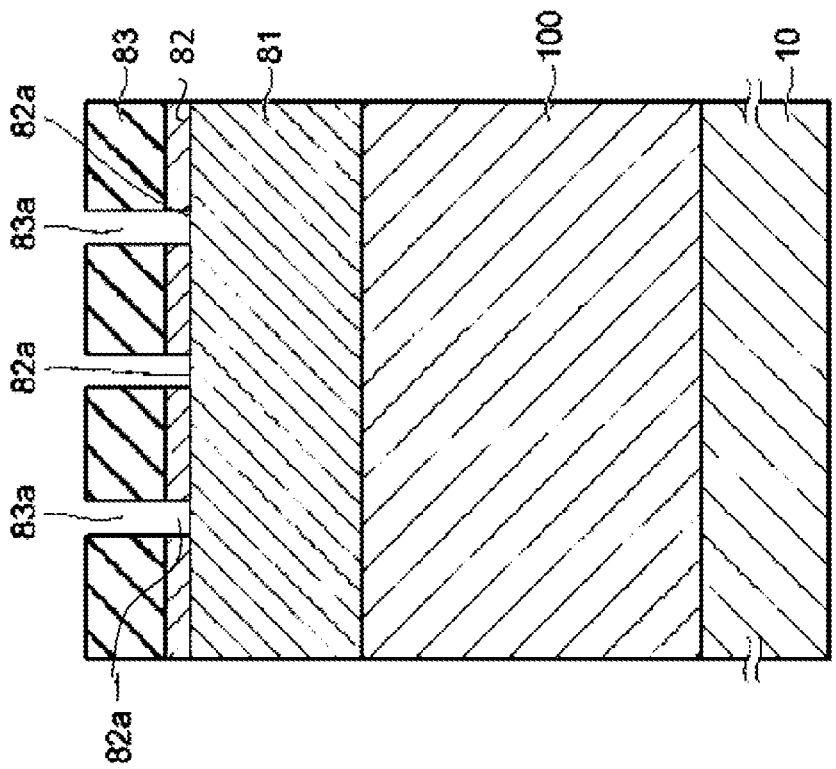

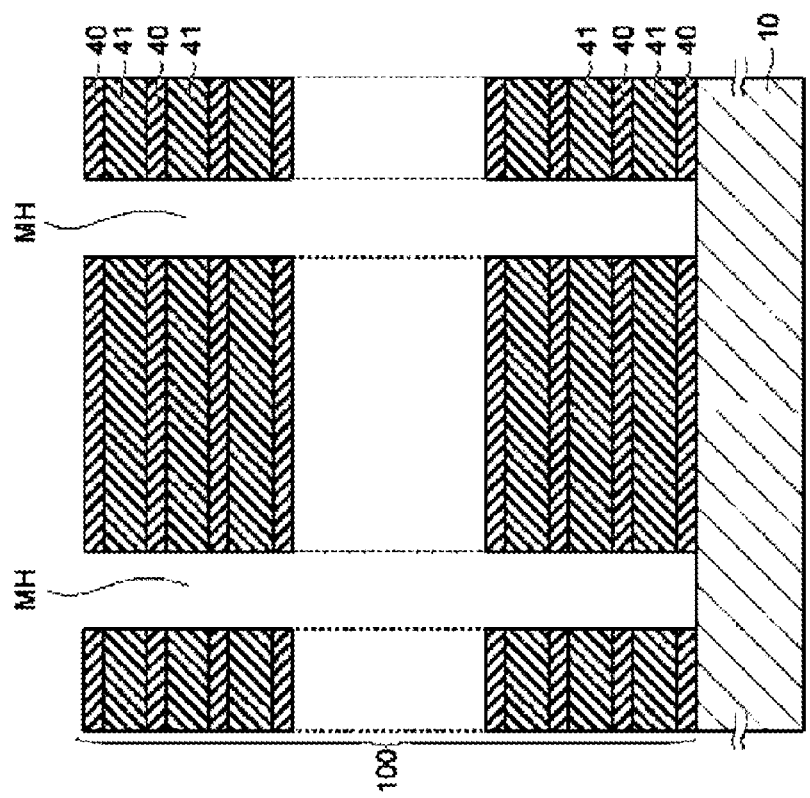
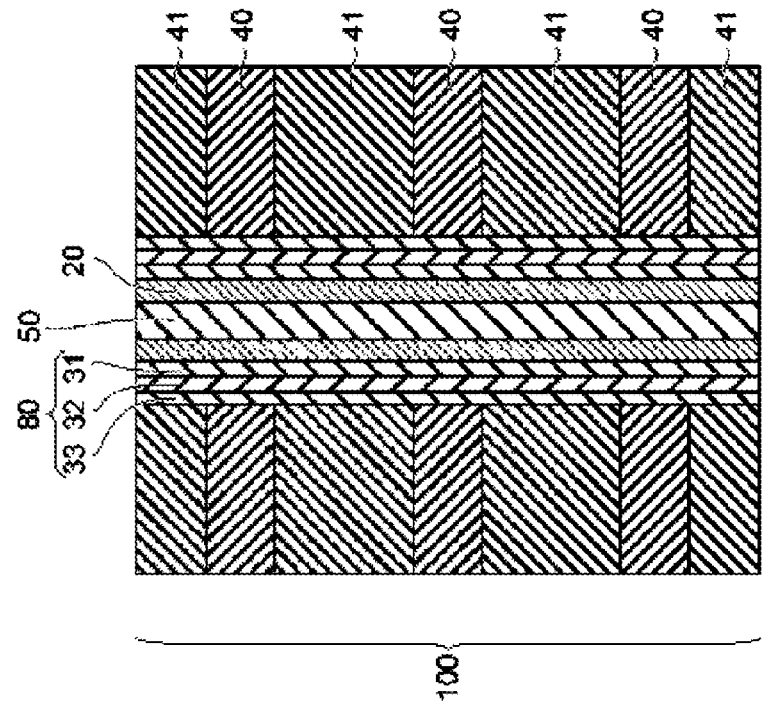

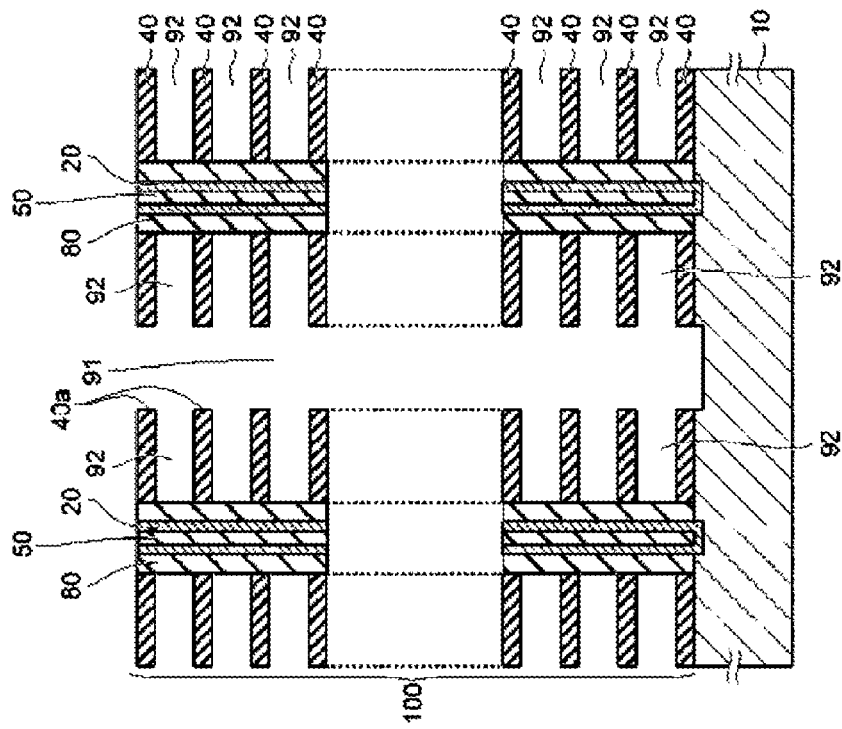
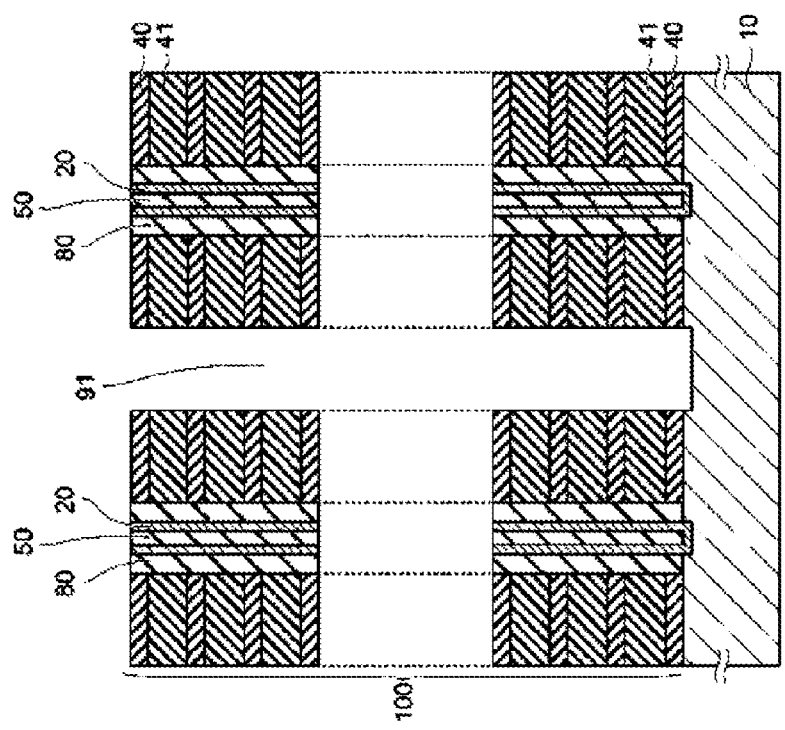

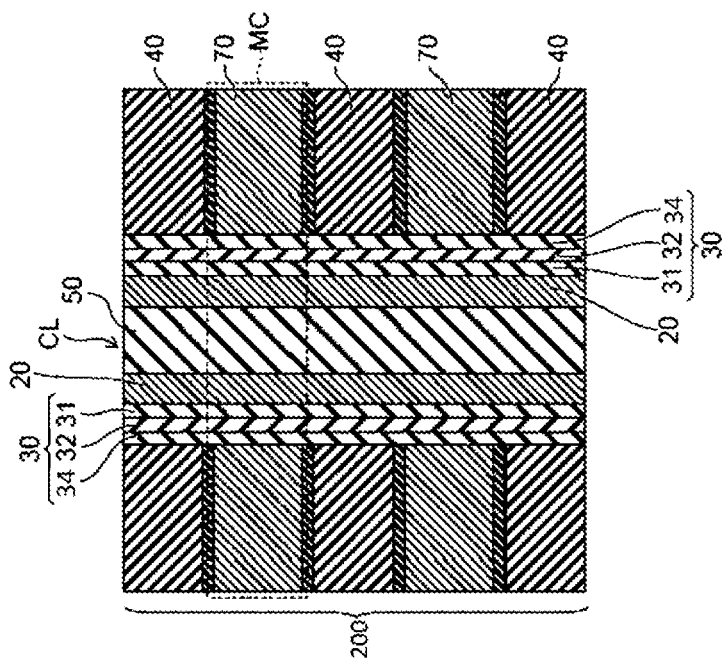
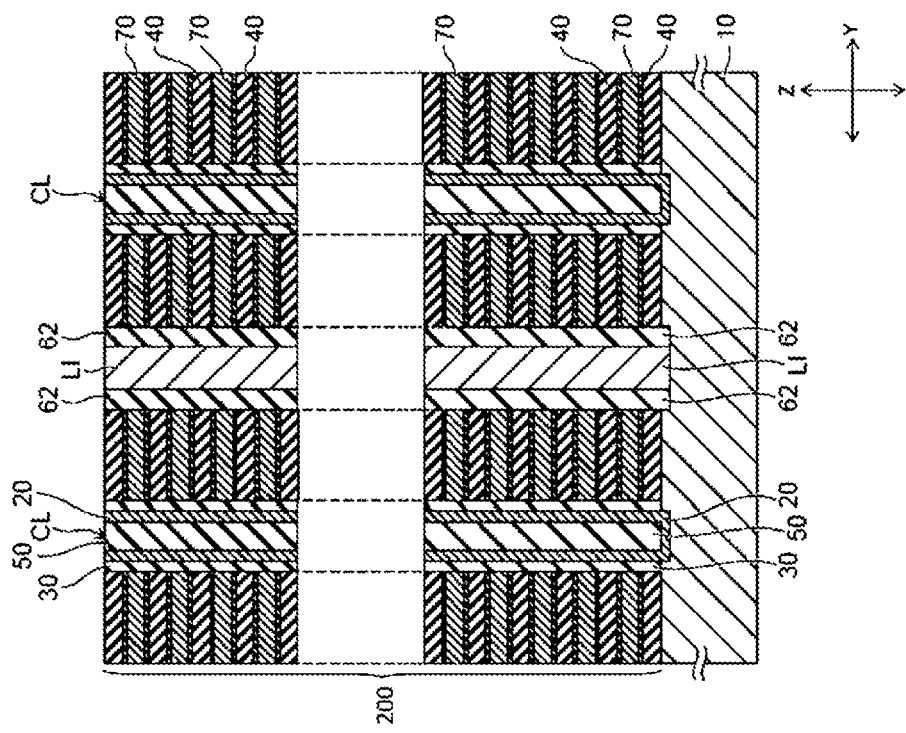

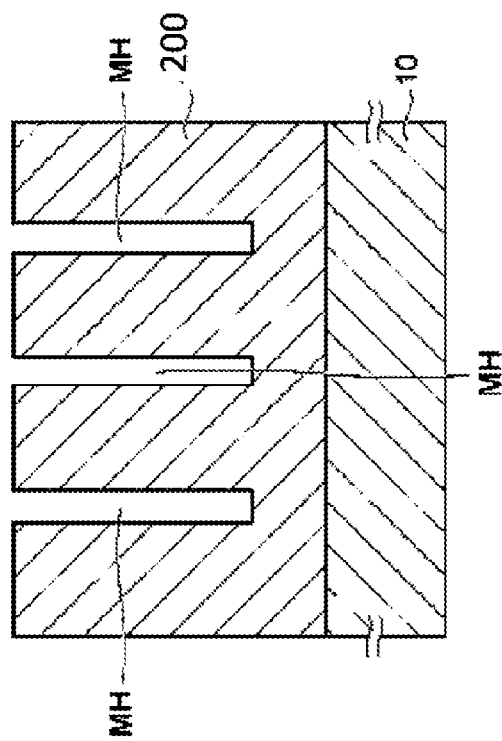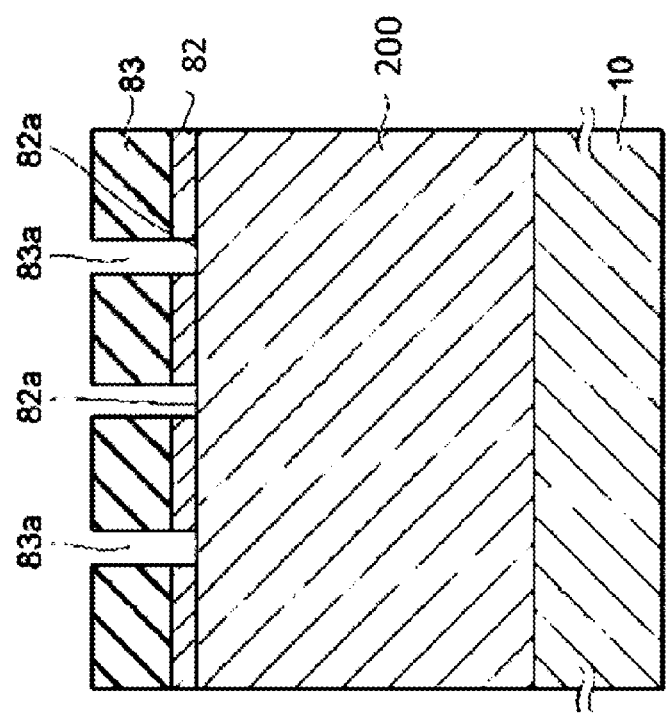

METHOD OF MANUFACTURING SEMICONDUCTOR DEVICE AND ETCHING MASK

CROSS-REFERENCE TO RELATED APPLICATION

This application claims the benefit of and priority to Japanese Patent Application No. 2017-046391, filed Mar. 10, 2017, the entire contents of which are incorporated herein by reference.

FIELD

Embodiments described herein relate generally to a method of manufacturing a semiconductor device and an etching mask.

BACKGROUND

Some methods of manufacturing a memory cell array having a three-dimensional structure involve forming a hole in a stacked body in which different types of materials are alternately stacked. However, when a bit density of the memory cell array is high and there is a corresponding large amount of stacked material, and the stacked body becomes thicker, the hole may have a high aspect ratio. In etching for forming a hole having a high aspect ratio, an amount of etching of a mask is also increased, and thus the mask may, in some cases, be readily deformed. The deformation of the mask affects the shape and dimensions of the hole formed in the stacked body.

DESCRIPTION OF THE DRAWINGS

FIG. 2A and FIG. 2B are schematic cross-sectional views of some embodiments of a semiconductor device according to the first aspect.

FIG. 4A and FIG. 4B are schematic cross-sectional views illustrating some embodiments of the method of manufacturing a semiconductor device according to the first aspect.

FIG. 5A and FIG. 5B are schematic cross-sectional views illustrating some embodiments of the method of manufacturing a semiconductor device according to the first aspect.

FIG. 7A and FIG. 7B are schematic cross-sectional views illustrating some embodiments of the method of manufacturing a semiconductor device according to the first aspect.

FIG. 8A and FIG. 8B are schematic cross-sectional views illustrating some embodiments of the method of manufacturing a semiconductor device according to the first aspect.

FIG. 9A and FIG. 9B are schematic cross-sectional views of some embodiments of a semiconductor device according to a second aspect.

FIG. 11A and FIG. 11B are schematic cross-sectional views illustrating some embodiments of the method of manufacturing a semiconductor device according to the second aspect.

DETAILED DESCRIPTION

Figure 1:
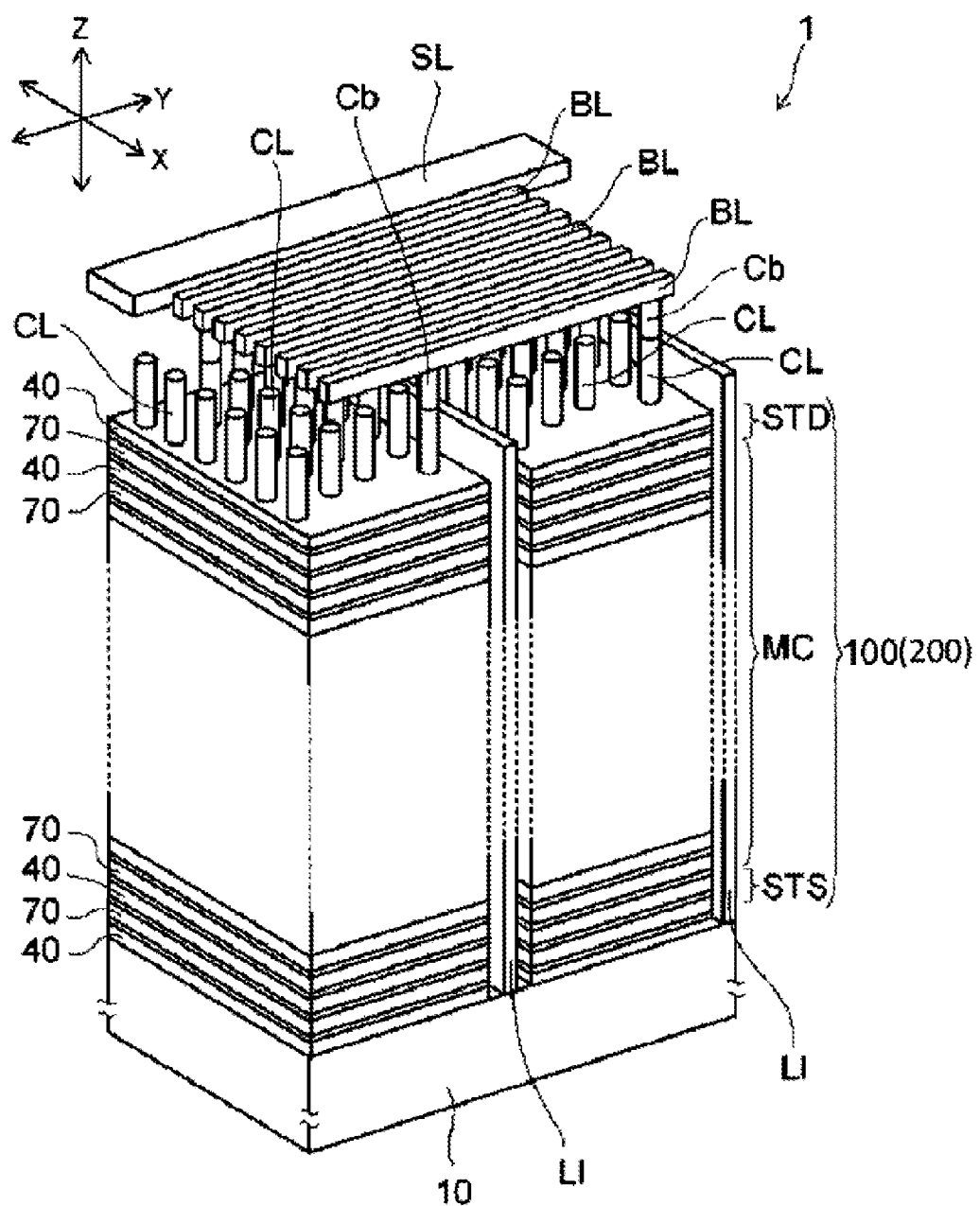
FIG. 1 is a schematic perspective view of some embodiments of a semiconductor device according to a first aspect.

Some example embodiments provide for a method of manufacturing a semiconductor device and an etching mask which are suitable for etching of a hole or a groove having a high aspect ratio.

In some embodiments, according to one aspect, a method of manufacturing a semiconductor device includes forming a mask layer including aluminum or an aluminum compound on a layer to be etched that includes at least one first metal selected from: tungsten, tantalum, zirconium, hafnium, molybdenum, niobium, ruthenium, osmium, rhenium, and iridium. The method of manufacturing a semiconductor device further includes patterning the mask layer, and etching the layer to be etched by using the patterned mask layer to form a hole or a groove in the layer to be etched.

In some embodiments, according to another aspect, an etching mask is formed on a layer to be etched, the etched layer including at least one first metal selected from tungsten, tantalum, zirconium, hafnium, molybdenum, niobium, ruthenium, osmium, rhenium, and iridium. The etching mask includes aluminum or an aluminum compound, and a second metal for which a boiling point of a chloride of the second metal is equal to or higher than about 800° C.

First Aspect

Hereinafter, some example embodiments according to a first aspect will be described with reference to accompanying drawings. In the drawings, same or similar components are denoted by the same reference numerals and signs.

Some embodiments of a semiconductor device according to the first aspect include a semiconductor storage device.

FIG. 1 is a schematic perspective view of some embodiments of a memory cell array 1 in a semiconductor storage device according to the first aspect.

In FIG. 1, two directions that are parallel to a top side of a substrate 10 and are perpendicular to each other are respectively depicted as an X-direction and a Y-direction, and a direction perpendicular to both the X-direction and the Y-direction is depicted as a Z-direction.

The memory cell array 1 includes the substrate 10, a stacked body 100 provided on the top side of the substrate 10, a plurality of columnar portions CL, one or more conductive components LI, and an upper layer interconnect provided on the stacked body 100. The upper layer interconnect depicted in includes bit lines BL and a source layer SL.

The columnar portion CL is formed in a columnar shape or an elliptic cylindrical shape so as to extend in the Z-direction within the stacked body 100. The conductive components LI extend in the Z-direction and the X-direction between the upper layer interconnect and the substrate 10, and separates the stacked body 100 into regions, or blocks, disposed along the Y-direction.

For example, the plurality of columnar portions CL are disposed in a staggered manner. Alternatively, the plurality of columnar portions CL may be disposed in a square lattice shape along the X-direction and the Y-direction.

The plurality of bit lines (which can include, for example, metal components) BL are provided on the stacked body 100. The plurality of bit lines BL are separated from each other in the X-direction, and the bit lines BL extend in the Y-direction.

An upper end of at least one of the columnar portions CL is connected to at least one of the bit lines BL through a contact portion Cb of the at least one columnar portion CL. At least two columnar portions CL disposed on opposite sides of the conductive components LI are connected to one common bit line BL.

FIG. 2A is a schematic cross-sectional view illustrating some embodiments of the stacked body 100, the columnar portion CL, and the conductive component LI. FIG. 2A illustrates a cross-section parallel to a Y-Z plane depicted in FIG. 1.

The stacked body 100 includes a plurality of conductive layers 70 and a plurality of insulating layers 40 which are stacked on the top side of the substrate 10. The plurality of conductive layers 70 are stacked in the Z-direction between the insulating layers 40.

For example, the conductive layer 70 is a tungsten layer including tungsten as a main component (is a majority tungsten by weight or by volume). For example, the insulating layer 40 includes silicon oxide ($SiO_2$) as a main component.

FIG. 2B is an enlarged view of a memory cell portion in FIG. 2A.

As illustrated in FIG. 2B, the columnar portion CL includes a memory film 30, a semiconductor film 20, and an insulating core film 50. The semiconductor film 20, which can have a pipe shape (e.g. which can define an inner space) and can surround at least a portion of the insulating core film 50, extends in the Z-direction within the stacked body 100. The memory film 30 is provided between the conductive layer 70 and the semiconductor film 20, and surrounds at least a portion of the semiconductor film 20 from an outer circumferential side. The core film 50 is provided on an inner side of the semiconductor film 20.

An upper end of the semiconductor film 20 is electrically connected to the bit line BL through the contact portion Cb illustrated in FIG. 1.

The memory film 30 includes a tunnel insulating film 31 as a first insulating film, a charge storage film 32, and a block insulating film 34 as a second insulating film. The charge storage film 32, the tunnel insulating film 31, and the semiconductor film 20 extend in the Z-direction of the stacked body 100 such that at least a portion of the charge storage film 32, at least a portion of the tunnel insulating film 31, and at least a portion of the semiconductor film 20 are continuous with each other. The block insulating film 34, the charge storage film 32, and the tunnel insulating film 31 are provided between the conductive layer 70 and the semiconductor film 20, in order from the conductive layer 70 side. The tunnel insulating film 31 is in contact with the semiconductor film 20. The charge storage film 32 is provided between the block insulating film 34 and the tunnel insulating film 31.

The semiconductor film 20, the memory film 30, and the conductive layer 70 constitute at least part of a memory cell MC. The memory cell MC has a vertical transistor structure in which the conductive layer 70 surrounds at least a portion of the semiconductor film 20 through the memory film 30.

In the memory cell MC having the vertical transistor structure, the semiconductor film 20 functions, for example, as a channel, and the conductive layer 70 functions, for example, as a control gate (control electrode). The charge storage film 32 functions, for example, as a data storage layer in which charge injected from the semiconductor film 20 is accumulated.

The semiconductor device of the depicted embodiments according to the first aspect is, for example, a non-volatile semiconductor storage device capable of freely electrically performing the erasure and writing of data and holding storage contents even when a power supply is turned off.

The memory cell MC is, for example, a charge trap type memory cell. The charge storage film 32 includes a large number of trap sites for capturing charge in an insulating film, and includes, for example, a silicon nitride film.

The tunnel insulating film 31 serves, for example, as a potential barrier when charge is injected into the charge storage film 32 from the semiconductor film 20 or when charge accumulated in the charge storage film 32 is diffused to the semiconductor film 20. The tunnel insulating film 31 includes, for example, silicon oxide.

The block insulating film 34 prevents charge accumulated in the charge storage film 32 from being diffused to the conductive layer 70. The block insulating film 34 includes, for example, a silicon oxide film. In addition, the block insulating film 34 prevents back tunneling of electrons from the conductive layer 70 during an erasing operation.

The block insulating film 34 is also provided between a conductive layer 70 and an insulating layer 40 that are adjacent to each other.

The block insulating film 34 between the conductive layer 70 and the charge storage film 32 and the block insulating film 34 between the conductive layer 70 and the insulating layer 40 are integrally provided so as to be continuous with each other.

A nitride film 60 is provided between the conductive layer 70 and the block insulating film 34. The nitride film 60 includes, for example, a titanium nitride film. The nitride film 60 increases adhesion between the conductive layer 70 and the block insulating film 34. In addition, the nitride film 60 prevents a metal included in the conductive layer 70 from being diffused to the block insulating film 34 side.

The nitride film 60 and the block insulating film 34 are not provided between the side surface of the insulating layer 40 and the charge storage film 32. A cover insulating film 33 is provided between a side surface of the insulating layer 40 and the charge storage film 32. The cover insulating film 33 is, for example, a silicon oxide film.

As illustrated in FIG. 1, a drain-side select transistor STD is provided at the upper end portion of the columnar portion CL, and a source-side select transistor STS is provided at a lower end portion thereof. Among the plurality of conductive layers 70, for example, the conductive layer 70 located at the lowermost layer functions as a control gate (control electrode) of the source-side select transistor STS. Among the plurality of conductive layers 70, for example, the conductive layer 70 located at the uppermost layer functions as a control gate (control electrode) of the drain-side select transistor STD. The drain-side select transistor STD and the source-side select transistor STS are vertical transistors in which current flows in the Z-direction of the stacked body 100, similar to the memory cell MC.

The plurality of memory cells MC are provided between the drain-side select transistor STD and the source-side select transistor STS. The plurality of memory cells MC, the drain-side select transistor STD, and the source-side select transistor STS are connected to each other in series through the semiconductor film 20, and constitute one memory string. The memory cells of the memory string are disposed, for example, in a staggered manner in a plane parallel to an X-Y plane, and in the memory cell array 1, the plurality of memory cells MC are provided along the X-direction, the Y-direction, and the Z-direction.

An insulating film 42 is provided on both side walls of the conductive component LI in the Y-direction which separates the stacked body 100 in the Y-direction, as illustrated in FIG. 2A. The insulating film 42 is provided between the stacked body 100 and the conductive component LI. In FIG. 1, the insulating film 42 is not illustrated.

The conductive component LI is a metal material including, for example, tungsten as a main component. The upper end of the conductive component LI is connected to the source layer SL, illustrated in FIG. 1, which is provided on the stacked body 100. A lower end of the conductive component LI is in contact with the substrate 10 as illustrated in FIG. 2A. In addition, a lower end of the semiconductor film 20 is in contact with the substrate 10. The substrate 10 includes, for example, a conductive silicon substrate doped with impurities. The lower end of the semiconductor film 20 is electrically connected to the source layer SL through the substrate 10 and the conductive component LI.

A film constituting at least a portion of the columnar portion CL is formed within a memory hole formed in the stacked body 100. The memory hole is formed by, for example, a reactive ion etching (RIE) method. The memory cells MC of the memory array 1 can be formed at a high density to help increase a storage capacity of the memory array 1. For example, a diameter of the memory hole may be equal to or less than about 100 nanometers (nm) (e.g. equal to or less than about 98 nm, equal to or less than about 96 nm, or equal to or less than about 94 nm), and a total number of stacked conductive layers 70 may be in a range of approximately 10 to approximately 100. Thus the memory hole can be a hole having a high aspect ratio.

In memory arrays having high capacity and/or a thick stacked body 100 (which can serve as a layer to be etched), the aspect ratio of the memory hole can be high, and it may be challenging to form a hole having a specified shape.

Next, a method of manufacturing a semiconductor device of some embodiments according to the first aspect will be described with reference to FIG. 3 through FIG. 8.

Figure 3:
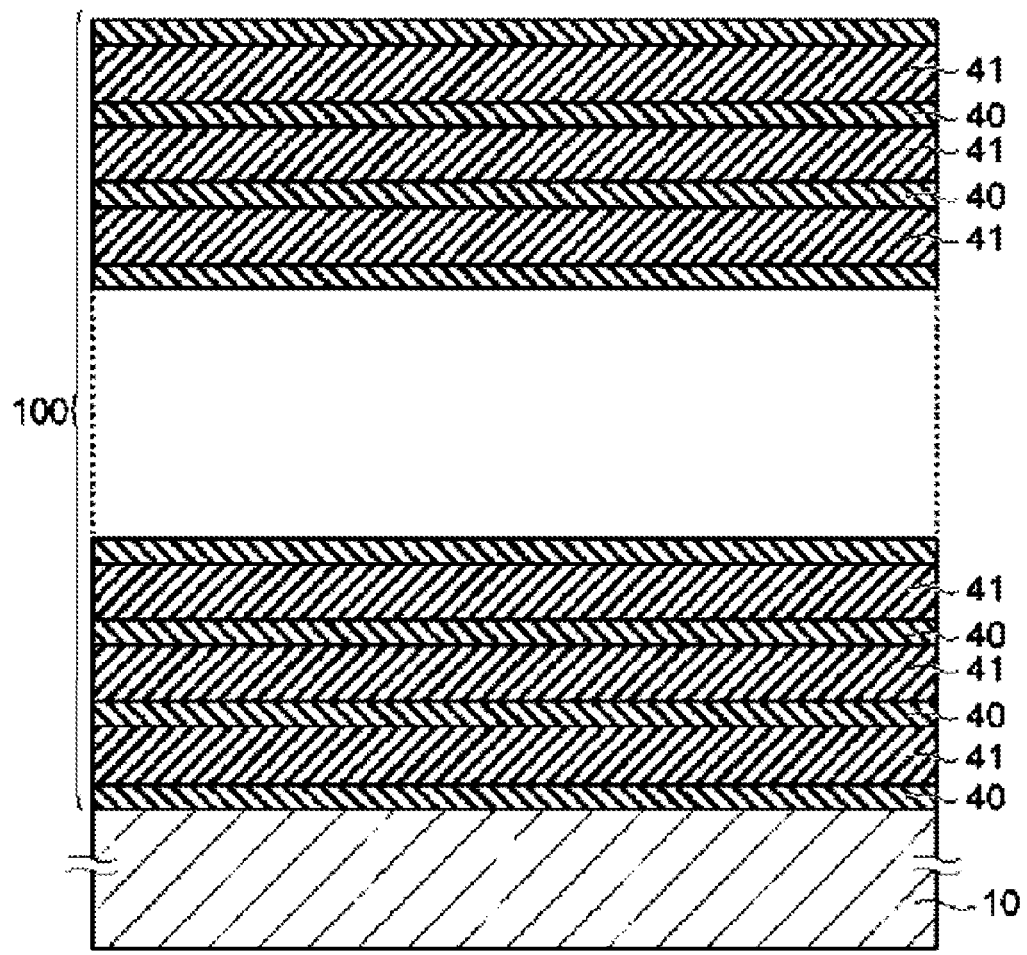
FIG. 3 is a schematic cross-sectional view illustrating some embodiments of a method of manufacturing a semiconductor device according to the first aspect.

As illustrated in FIG. 3, the stacked body 100 is formed or disposed on the substrate 10. The stacked body 100 maybe a layer to be etched. The substrate 10 includes, for example, a silicon substrate.

The insulating layer 40 is formed or disposed on the top side of the substrate 10, and a sacrificial layer 41 of a different type of material from that of the insulating layer 40 is formed or disposed on the insulating layer 40. A process of alternately laminating the insulating layer 40 and the sacrificial layer 41 is repeated a plurality of times, and the stacked body 100 including the plurality of insulating layers 40 and the plurality of sacrificial layers 41 is formed or disposed on the substrate 10.

For example, a silicon oxide film is formed as the insulating layer 40 by a chemical vapor deposition (CVD) method, and, for example, a silicon nitride film (SiN film) is formed as the sacrificial layer 41 by a CVD method. The sacrificial layer 41 is removed in a subsequent process, and the block insulating film 34, the nitride film 60, and the conductive layer 70 are formed in a void (space), defined by the insulating layers 40, from which the sacrificial layer 41 was removed.

The sacrificial layer 41 may be a layer having a high etching selection ratio with respect to the insulating layer 40, and is not limited to the above-described silicon nitride film. For example, a polycrystalline silicon film may be formed as the sacrificial layer 41 by a CVD method.

A first mask layer 81 is formed or disposed on the stacked body 100 as illustrated in FIG. 4A. A second mask layer 82 is formed or disposed on the first mask layer 81. A resist 83 is formed or disposed on the second mask layer 82.

For example, the first mask layer 81 is a layer of a different type of material from that of the stacked body 100 (e.g. different from a material of either, or both, the insulating layer 40 and the sacrificial layer 41). The first mask layer 81 includes, for example, tungsten (W), and may further include boron (B) and carbon (C). For example, a composition ratio of tungsten in the first mask layer 81 is higher than the composition ratio of boron and is higher than the composition ratio of carbon. As used herein, the term "composition ratio" refers to an atomic percent. The first mask layer 81 is formed by, for example, a sputtering method, a plasma CVD method, or a thermal CVD method.

The second mask layer 82 is, for example, an aluminum (Al) layer (e.g. a layer formed of approximately pure aluminum, or a compound layer including aluminum). That is, the second mask layer 82 is, for example, an aluminum layer, an aluminum oxide layer including aluminum oxide ($AlO_x$) as a main component, an aluminum boride layer including aluminum boride ($AlB_x$) as a main component, or an aluminum nitride layer including aluminum nitride ($AlN_x$) as a main component. However, the type of second mask layer 82 is not limited to the above-described type. The second mask layer 82 is formed by, for example, a sputtering method, a plasma CVD method, or a thermal CVD method.

The resist 83 is formed by, for example, a coating method.

As illustrated in FIG. 4B, a plurality of holes 83a are formed in the resist 83 by exposing and developing the resist 83.

As illustrated in FIG. 5A, the second mask layer 82 is patterned by an RIE method in which the resist 83 having the holes 83a formed therein is used as a mask. The plurality of holes 82a are formed in the second mask layer 82.

Similarly, as illustrated in FIG. 5B, the first mask layer 81 is patterned by an RIE method in which the resist 83 and the second mask layer 82 are used as masks. The plurality of holes 81a are formed in the first mask layer 81. As an etching gas at this time, a gas including fluorine, an oxidizing gas, and/or a gas including silicon and chlorine are used. Examples of the gas including fluorine include a gas including $CF_4$, $C_4F_8$, $C_4F_6$, or $CHF_3$, and the like. As the oxidizing gas, a gas including $O_2$, $O_3$, $CO$, $CO_2$, or $N_2O$ and the like may be implemented. As the gas including silicon and chlorine, $SiCl_4$, $SiH_2Cl_2$, and the like may be implemented. The resist 83 may be erased or removed during the etching of the first mask layer 81.

Figure 6A:
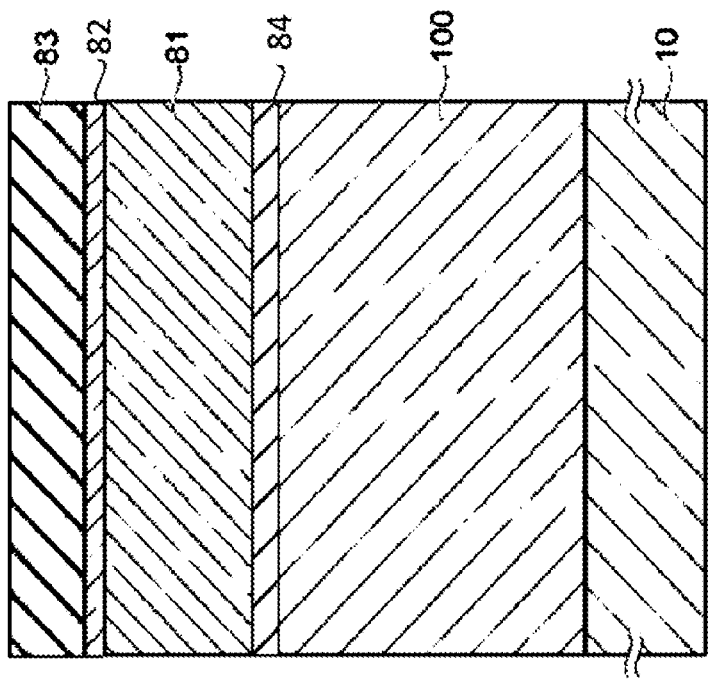
FIG. 6A and FIG. 6B are schematic cross-sectional views illustrating some embodiments of the method of manufacturing a semiconductor device according to the first aspect.

Next, as illustrated in FIG. 6A, the stacked body 100 is patterned by an RIE method in which the first mask layer 81 is used as a mask. A plurality of memory holes MH are formed in the stacked body 100. At this time, the etching of the stacked body 100 is performed using a gas including fluorine, and the sacrificial layer 41 and the insulating layer 40 are successively etched by using the same etching gas.

Thus, in some embodiments of a method of manufacturing a memory cell array 1 according to the first aspect, the second mask layer 82 including aluminum is used as an etching mask of the first mask layer 81 including tungsten.

Figure 13:
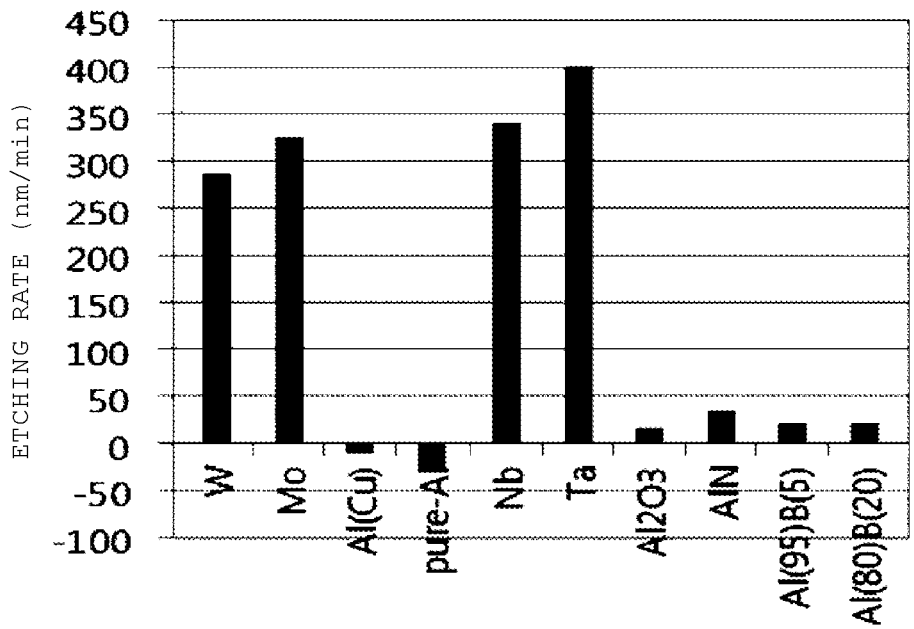
FIG. 13 is a graph showing etching rates of films of various materials.

Referring now to FIG. 13, some measurement results of etching rates for films of various materials are illustrated. In the results shown in FIG. 13, it is assumed that etching is performed under a gas flow of $CF_4$, $O_2$, and $SiCl_4$ gas at 40, 60, 24 standard cubic centimeters per minute (sccm), respectively. An etching device or process to be used is not particularly limited.

According to the measurement results of FIG. 13, an etching rate of the tungsten film is approximately 285 nm per minute (nm/min), and all of the etching rates of the aluminum compound films are equal to or less than about 35 nm/min. That is, the tungsten film has a high etching selection ratio with respect to the aluminum compound films (e.g. the etching rate of the tungsten film is larger than an etching rate of any of the referenced aluminum compound films by a factor of about 8, a factor of about 7, a factor of about 6, or a factor of about 5). In addition, the embodiments of the present disclosure are not limited to implementing tungsten as a film with a high etching selection ratio with respect to an aluminum compound, and a film including, for example, molybdenum (Mo), niobium (Nb), or tantalum (Ta) as a main component may also be implemented as a film having a high etching selection ratio with respect to the aluminum compound.

That is, a mask including tungsten, molybdenum, niobium, or tantalum as a main component may be used as the first mask layer 81, and a mask including, for example, an aluminum compound as the etching mask of the first mask layer 81 may be used as the second mask layer 82, whereby it is possible to reduce the film thickness of the second mask layer 82 as compared with a case where the other materials are used.

Tungsten which is a metal included in the first mask layer 81 as a main component belongs to a class of elements having a similar sputtering rate (e.g. in an ion etching process) as other metals that are used in a semiconductor process, and the same is true of molybdenum, niobium, and tantalum. For at least this reason, as a metal included in the first mask layer 81 as a main component, it may be advantageous to use zirconium, hafnium, ruthenium, osmium, rhenium, or iridium alternatively, or in addition to the above-described metals.

That is, in some embodiments, the first mask layer 81 includes at least one kind of metal selected from tungsten, tantalum, zirconium, hafnium, molybdenum, niobium, ruthenium, osmium, rhenium, and iridium.

Tungsten, tantalum, zirconium, hafnium, molybdenum, and niobium are readily applied in a semiconductor process and have a contamination risk, and some embodiments implement at least one of these metals to achieve these advantages.

Figure 6B:
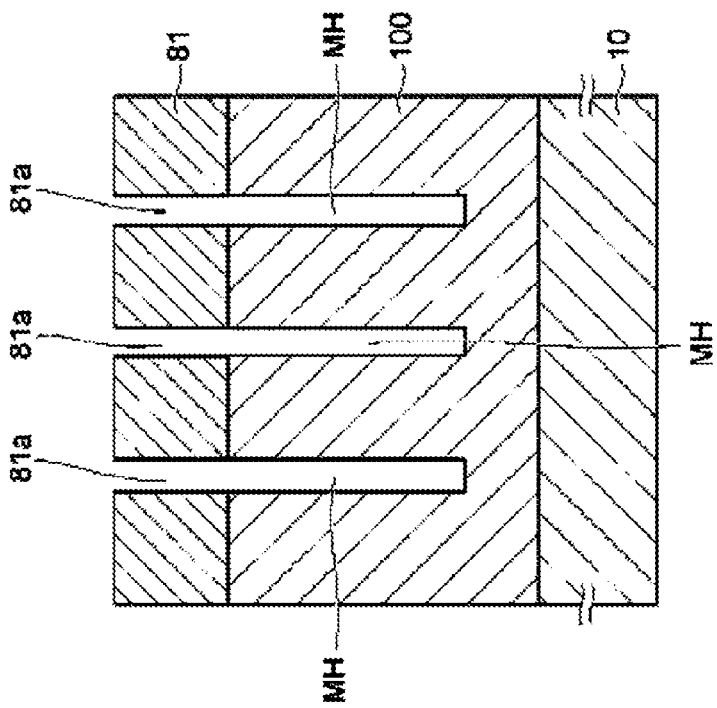

Referring now to FIG. 6B, in the above-described etching of the memory hole MH, in some embodiments, the etching may be performed by forming or disposing an intermediate layer 84 between the stacked body 100 and the first mask layer 81 as illustrated in FIG. 6B. The intermediate layer 84 is a layer of a different type of material from those of the stacked body 100 and the first mask layer 81. The intermediate layer 84 is, for example, an amorphous carbon layer including amorphous carbon as a main component, a boron carbide layer including boron carbide (BC) as a main component, a boron nitride layer including boron nitride (BN) as a main component, or an amorphous silicon layer including amorphous silicon (α-Si) as a main component. The intermediate layer 84 is formed by, for example, a plasma CVD method.

A plurality of memory holes MH are formed in the stacked body 100 as illustrated in FIG. 7A by the above-described etching using the first and second mask layers 81 and 82. The memory holes MH extend in the Z-direction of the stacked body 100 and traverse the stacked body 100 to reach the substrate 10.

A stacked film 80, the semiconductor film 20, and the core film 50 are formed or disposed within the memory hole MH as shown in an enlarged view provided in FIG. 7B. The stacked film 80 includes the cover insulating film 33, the charge storage film 32, and the tunnel insulating film 31.

First, for example, a silicon oxide film is formed or disposed on a side surface of the memory hole MH as the cover insulating film 33 by, for example, an atomic layer deposition (ALD) method. The cover insulating film 33 is also formed or disposed at the bottom of the memory hole MH (e.g. on a top surface of the substrate 10).

The charge storage film 32 and the tunnel insulating film 31 are formed in order on an inner side of the cover insulating film 33 by an ALD method.

A space remains on the inner side of the stacked film 80, and a portion of the stacked film 80 deposited at the bottom of the memory hole MH under the cavity is removed by, for example, an RIE method. Thereafter, the semiconductor film 20 is formed or disposed on a side surface of the tunnel insulating film 31.

The semiconductor film 20 is formed or disposed at the bottom of the memory hole MH as illustrated in FIG. 8A, and is in contact with the substrate 10. The semiconductor film 20, for example, a silicon film, is formed by a CVD method. A space remains on the inner side of the semiconductor film 20, and the core film 50 is formed in or deposited in (e.g. approximately fills) the cavity.

Next, as illustrated in FIG. 8A, a groove 91 is formed in the stacked body 100. It is possible to form the groove 91 by the same RIE method using the same mask used for formation of the memory hole MH. The groove 91 extends in the X-direction, and partitions the stacked body 100 along the Y-direction.

Next, as illustrated in FIG. 8B, the sacrificial layer 41 is removed by, for example, wet etching using hot phosphoric acid supplied through the groove 91. Voids (or spaces, holes or trenches) 92 are formed between the insulating layers 40 by the removal of the sacrificial layers 41 (e.g. voids 92 defined by the insulating layers 40 and the stacked film 80). The charge storage film 32 is protected by the cover insulating film 33. As the wet etching continues, at least a portion of the cover insulating film 33 defining the voids 92 is removed, thus extending the voids 92 to the charge storage film 32, such that the charge storage film 32 defines, in part, the voids 92.

Next, the block insulating film 34 and the nitride film 60 are formed in order on inner walls of the voids 92. The block insulating film 34 and the nitride film 60 are conformally formed along upper surfaces and lower surfaces of the insulating layers 40 that define the voids 92, and on the charge storage film 32.

Conductive layers 70, which can be, for example, tungsten layers, are used to substantially fill the voids 92.

Thereafter, the insulating film 42 is formed in the groove 91, and the conductive component LI is formed in the groove 91, and the bit lines BL, the source layer SL, and the like illustrated in FIG. 1 are formed to manufacture a memory cell array 1 as shown in FIG. 2A.

According to some embodiments of the method of manufacturing a semiconductor device according to the first aspect, it is possible to use a thin second mask layer including an aluminum compound as an etching mask for the first mask layer, which includes tungsten, during etching when forming the memory hole MH in the stacked body 100.

A processing time of a mask can be reduced by use of the thin mask, thereby improving productivity. Further, an aspect ratio becomes lower when processing a film to be processed by using the thin mask, and thus it is possible to further increase an etching rate and to improve productivity.

Second Aspect

Hereinafter, some embodiments of a semiconductor device and a method of manufacturing the semiconductor device according to a second aspect will be described.

The method of manufacturing the semiconductor device according to a second aspect is different from the method of manufacturing the semiconductor device according to the first aspect in that a method of manufacturing a stacked body differs, and in that a first mask layer is not used. In the following description, differences from the first aspect will be described, and a description of similar steps or processes will be omitted.

FIG. 9A is a cross-sectional view along the YZ plane of a semiconductor device according to the second exemplary embodiment, and FIG. 9B is an enlarged view of a memory cell portion of the semiconductor device. FIG. 9A and FIG. 9B correspond to FIG. 2A and FIG. 2B which shown embodiments according to the first aspect, and certain components other than the components illustrated in FIGS. 9A and 9B may be similar to or the same as those according to the first aspect.

As illustrated in FIG. 9A and FIG. 9B, a stacked body 200 includes a plurality of conductive layers 70 and a plurality of insulating layers 40. The plurality of conductive layers 70 and the plurality of insulating layers 40 are alternately stacked in a direction (Z-direction) perpendicular to the top side of a substrate 10.

The conductive layer 70 includes at least one of tungsten, tantalum, zirconium, hafnium, molybdenum, niobium, ruthenium, osmium, rhenium, and iridium. Tungsten applied in a semiconductor process may be used. The insulating layer 40 includes silicon oxide as a main component.

A memory film 30 is a stacked film including a block insulating film 34, a charge storage film 32, and a tunnel insulating film 31. The block insulating film 34, the charge storage film 32, the tunnel insulating film 31, and a semiconductor film 20 extend in the Z-direction of the stacked body 200 so as to be continuous with each other. The block insulating film 34, the charge storage film 32, and the tunnel insulating film 31 are provided between the stacked body 200 and the semiconductor film 20 in order from the stacked body 200 side. Unlike the block insulating film 42 shown in FIG. 2B, for example, the block insulating film 34 is continuous in the Z-direction between memory cells MC.

Other structures and functions of the semiconductor device according to the second aspect may be similar to or the same as those according to the first aspect.

Next, some embodiments of a method of manufacturing a semiconductor device according to the second aspect will be described with reference to the accompanying drawings.

Figure 10A:
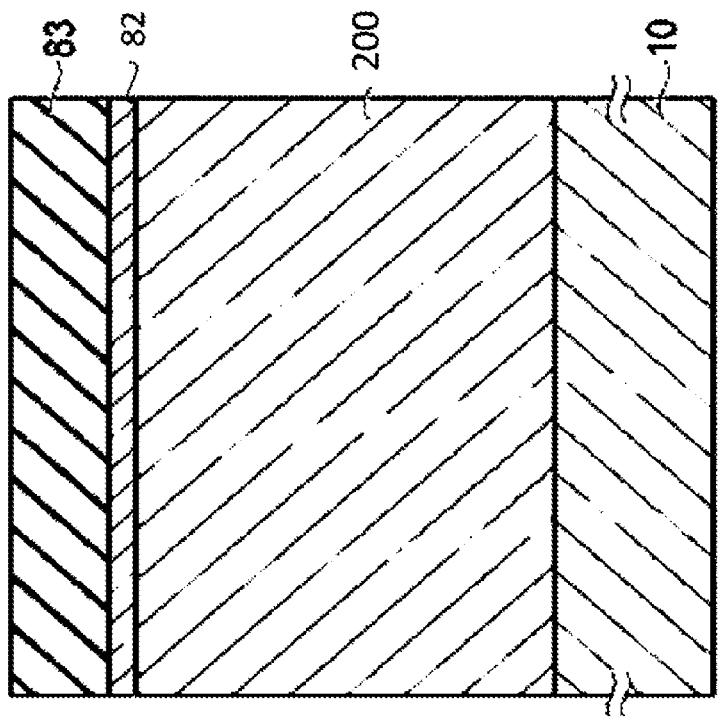
FIG. 10A and FIG. 10B are schematic cross-sectional views illustrating some embodiments of a method of manufacturing a semiconductor device according to the second aspect.

As illustrated in FIG. 10A, the stacked body 200 is formed or disposed on the substrate 10 as a layer to be etched. The stacked body 200 is formed such that the insulating layers 40 and the conductive layers 70 are alternately stacked on the substrate 10 by, for example, a sputtering method or a CVD method.

A second mask layer 82 is formed or disposed on the stacked body 200. A resist 83 is formed or disposed on the second mask layer 82. An intermediate layer (not shown), which may be similar to the intermediate layer 84 shown in FIG. 6B, may be provided between the second mask layer 82 and the stacked body 200. The intermediate layer is, for example, an amorphous carbon layer including amorphous carbon as a main component, a boron carbide layer including boron carbide (BC) as a main component, a boron nitride layer including boron nitride (BN) as a main component, or an amorphous silicon layer including amorphous silicon as a main component. The intermediate layer is formed by, for example, a plasma CVD method.

The second mask layer 82 is a layer including aluminum or an aluminum compound which is similar to, or the same as, that implemented in the memory cell array according to the first aspect. The resist 83 may also be the same as, or similar to that implemented in the memory cell array according to the first aspect.

Figure 10B:
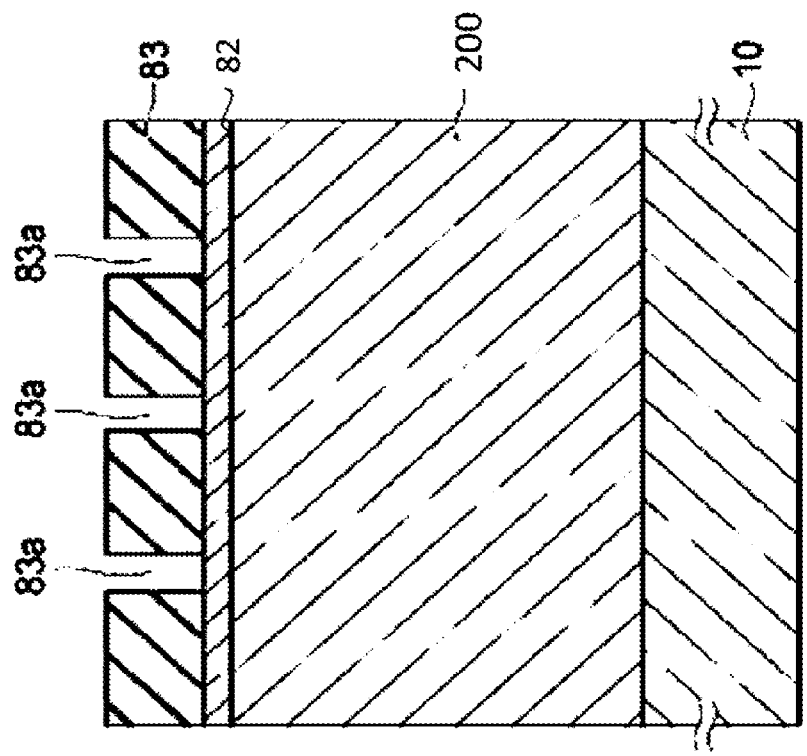

As illustrated in FIG. 10B, a plurality of holes 83a are formed in the resist 83 by exposing and developing the resist 83, and the second mask layer 82 is patterned by an RIE method in which the resist 83 having the holes 83a formed therein is used as a mask. As illustrated in FIG. 11A, a plurality of holes 82b (which may be an extension of the holes 83a) are formed in the second mask layer 82.

Next, as illustrated in FIG. 11B, the stacked body 200 is patterned by an RIE method in which the second mask layer 82 is used as a mask, and a plurality of memory holes MH are formed in the stacked body 200. At this time, as an etching gas used when etching the stacked body 200, for example, gases such as a gas including fluorine, an oxidizing gas, and a gas including silicon and chlorine (e.g. a $CF_4$ gas, a $O_2$ gas, and/or a $SiCl_4$ gas) are used, as discussed below.

Figure 12:
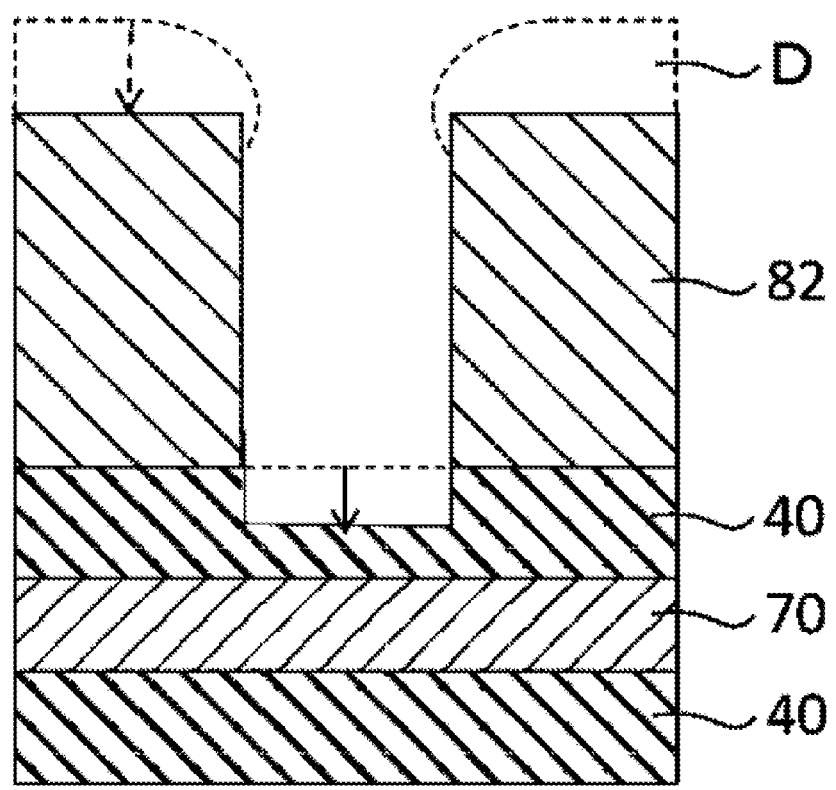
FIG. 12 is a schematic cross-sectional view illustrating some embodiments of the method of manufacturing a semiconductor device according to the second aspect.

For example, the stacked body 200 according to the second aspect has a structure in which an insulating layer including a silicon oxide film and a conductive layer including tungsten are alternately stacked. In a case where $CF_4$, $O_2$, and/or $SiCl_4$ gases are used as etching gases, $SiO_2$ (deposit D) generated by the reaction of $O_2$ and $SiCl_4$ gases is deposited on the second mask layer 82 as illustrated in FIG. 12, and the deposit D is preferentially etched during etching, whereby it is possible to further improve an etching selection ratio of the second mask layer 82.

Further, the second mask layer 82 is a layer including aluminum or an aluminum compound as described above. As illustrated in FIG. 13, an etching rate of an aluminum compound in a process that implements $CF_4$, $O_2$, and/or $SiCl_4$ gases is low. Thus, since etching selection ratios of silicon oxide and tungsten with respect to aluminum or an aluminum compound are high, it is possible to implement a thin second mask layer 82.

Meanwhile, the flow rate of the etching gas is, for example, 40 sccm, 60 sccm, and 24 sccm for $CF_4$, $O_2$, and $SiCl_4$, respectively. However, embodiments of the present disclosure are not limited thereto, and may be implemented with another flow rate having a flow ratio of a gas including fluorine, a gas including oxygen, and a gas including silicon and chlorine being 40:60:24.

After the memory holes are formed, a memory film 30, a semiconductor film 20, and a core film 50 are formed as illustrated in FIG. 9, thereby completing the semiconductor device according to the second aspect.

The method of manufacturing a semiconductor device according to the second aspect provides for a thin mask by using the mask including an aluminum compound as an etching mask of a stacked body configured with an insulating layer and a conductive layer.

In addition, a deposit deposited on the surface of the etching mask may be etched by using a gas including fluorine, an oxidizing gas, and a gas including silicon and chlorine as etching gases, and thus it is possible to further improve an etching selection ratio of the second mask layer 82. This also provides for a thin mask layer. Further, a difference between etching rates of the insulating layer and the conductive layer is not large, and thus it is possible to process the insulating layer and the conductive layer at the same time, which can further improve manufacturing efficiency.

The above-described deposit may be deposited on the surface of the mask so as to not obstruct etching.

Third Aspect

Hereinafter, some embodiments according to a third aspect will be described.

Some embodiments according to the third aspect differ from some embodiments according to the second aspect in a selection of material for the second mask layer 82. A semiconductor device of some embodiments according to the third aspect is a stacked body of an insulating layer and a conductive layer that is the same as, or similar to, that of some embodiments according to the second aspect, and some embodiments of a method of manufacturing the semiconductor device according to the third aspect may be the same as, or similar to, some embodiments of a method of manufacturing the semiconductor device according to the second aspect.

A second mask layer 82' according to the third aspect is a layer of a metal compound or an alloy including aluminum or an aluminum compound and a metal for which a boiling point of a chloride of the metal is equal to or higher than about 800 degrees Celsius (° C.) (e.g. equal to or higher than about 810° C., equal to or higher than about 820° C., or equal to or higher than about 830° C.). The metal for which a boiling point of a chloride of the metal is equal to or higher than about 800° C. is, for example, chromium (Cr). In some embodiments according to the second aspect, the second mask layer 82' is formed, for example, by adding chromium as a metal for which a boiling point of a chloride of the metal is equal to or higher than about 800° C. to the layer of an aluminum compound which is used in the first and second aspects.

In some embodiments of a method of manufacturing a semiconductor device according to the second aspect, when the stacked body 200 is etched by using the second mask layer 82' as an etching mask (e.g. as shown in FIG. 11A), a reaction rate of a gas including chlorine may be dependent on, for example, an etching condition, and the etching rate of the second mask layer 82' may be more than desired. By implementing the second mask layer 82' according to the third aspect, for example, chromium is added to aluminum or an aluminum compound of the second mask layer 82', and thus it is possible to reduce the etching rate of the second mask layer 82' even under a condition in which the reaction rate of a gas including chlorine is large.

For example, a boiling point of a chloride of aluminum (for example, $Al_2Cl_6$) which is used in the second mask layer 82' is approximately 160° C. Such a chloride of aluminum may be considered volatile. For this reason, in etching using a gas including chlorine, it may be difficult to control the etching rate of the second mask layer 82' (e.g. the etching rate may be more than desired). On the other hand, boiling points of chlorides of chromium (e.g. $CrCl_2$ and $CrCl_3$) are about 1304° C. and about 945° C., respectively. Thus, it is possible to reduce an etching rate by adding to the second mask layer 82' a material for which a boiling point of a chloride of the material is high, such as chromium.

Thus, it is possible to manufacture the semiconductor device providing for at least some of the same advantages as are provided for by the second aspect even when implementing a reaction of a gas including chlorine.

An amount of chromium included in the second mask layer 82' is, for example, in a range of about 2 atomic percent to about 66.7 atomic percent.

Figure 14:
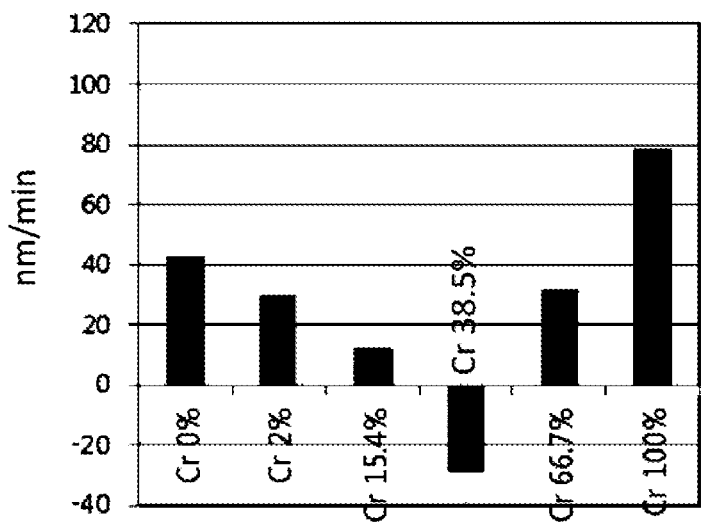
FIG. 14 is a graph showing etching rates of films of various materials.

FIG. 14 illustrates an etching rate of aluminum under a condition different from that in FIG. 13. The horizontal axis represents the amount of chromium included (atomic percent) in a material to be etched, and the vertical axis represents an etching rate (nm/min).

As illustrated in FIG. 14, an etching rate of an aluminum compound including substantially no chromium (labeled as "CR 0%") is approximately 41 nm/min. On the other hand, etching rates of aluminum compounds including chromium of about 2 atomic percent, about 15.4 atomic percent, and about 38.5 atomic percent are approximately 30 nm/min, 12.5 nm/min, and −28.5 nm/min, respectively. The etching rates for each material that includes chromium is reduced as compared to the material that does not include chromium.

Therefore, it is possible to reduce the etching rate by including chromium in a range of about 2 atomic percent to about 66.7 atomic percent in an aluminum compound, and it is possible to obtain a mask material having a high etching selection ratio with respect to the stacked body 200 even under a condition in which the etching rate is increased by, for example, a gas including chlorine or the like.

Figure 15:
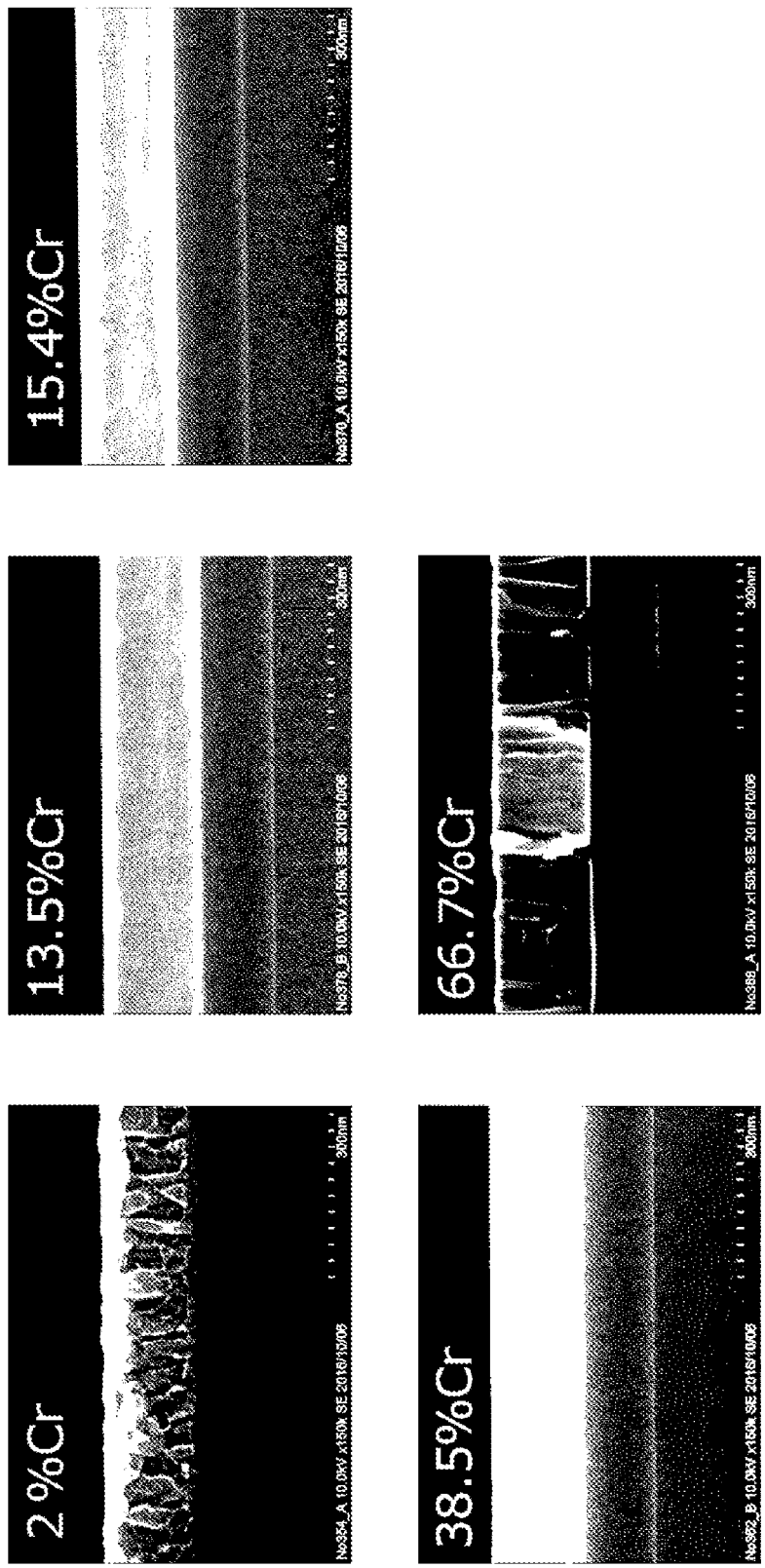
FIG. 15 is a diagram illustrating cross-sectional structures of various materials.

In addition, FIG. 15 illustrates results obtained by performing X-ray crystal structure analysis of a cross-sectional structure of some of the compounds referred to in FIG. 14.

As illustrated in FIG. 15, the cross-sections of aluminum compounds including chromium of about 2 atomic percent and about 66.7 atomic percent are organized (crystallized). On other hand, the cross-sections of aluminum compounds respectively including chromium of about 13.5 atomic percent, about 15.4 atomic percent, and about 38.5 atomic percent are not crystallized, and thus the surfaces thereof are smooth. The cross-sections being crystallized leads to a property that sharpening is easily performed during etching. That is, it is possible to obtain a mask material having a higher etching selection ratio by preferably adding chromium in a range of about 13.5 atomic percent to about 38.5 atomic percent.

In some embodiments of the method of manufacturing the semiconductor device according to the third aspect, it is thus possible to implement a thin mask by using a metal compound (for example, an aluminum compound including chromium), which includes a metal for which a boiling point of a chloride of the metal is equal to or higher than about 800° C. to a metal including aluminum or an aluminum compound, as an etching mask of the stacked body 200, and to further increase productivity.

Meanwhile, the configurations of the semiconductor devices described in the first to third aspects are just examples, and are not particularly limited.

As used herein, directional terms such as "up", "down", "left", "right," "top," "bottom," "on," and "under" are used in a relative context with an assumption that a surface, on which circuitry may be formed, of the below-described semiconductor substrates faces up, and thus these directional terms do not necessarily correspond to directions that correspond to a direction of gravitational acceleration.

As used herein, the terms "about," "approximately," and "substantially" are used to describe and account for small variations. When used in conjunction with an event or circumstance, the terms "about," "approximately," and "substantially" can refer to instances in which the event or circumstance occurs precisely as well as instances in which the event or circumstance occurs to a close approximation. For example, when used in conjunction with a numerical value, the terms "about," "approximately," and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure, and various embodiments and aspects may be combined. The accompanying claims and their equivalents are intended to cover such forms or modifications as would fall within the scope and spirit of the present disclosure.

What is claimed is:

1. A method of manufacturing a semiconductor device, the method comprising:
    forming a first patterned mask layer comprising aluminum or an aluminum compound on a second mask layer to be etched, the second mask layer to be etched comprising at least one first metal selected from tungsten, tantalum, zirconium, hafnium, molybdenum, niobium, ruthenium, osmium, rhenium, and iridium, wherein the second mask layer further comprises (i) tungsten and (ii) at least one of boron or carbon, and wherein the second mask layer is disposed on a stacked body;
    patterning the second mask layer by etching using the first patterned mask layer; and
    etching the stacked body by using the patterned second mask layer to form a hole or a groove in the stacked body.

2. The method according to claim 1,
    wherein etching the stacked body is performed using a gas comprising fluorine, an oxidizing gas, and a gas comprising silicon and chlorine.

3. The method according to claim 2,
    wherein the first patterned mask layer further comprises a second metal for which a boiling point of a chloride of the second metal is equal to or higher than about 800 degrees Celsius (° C.).

4. The method according to claim 3,
    wherein the second metal comprises chromium.

5. The method according to claim 4,
    wherein the second metal is included in the first patterned mask layer such that the second metal constitutes between about 2 atomic percent and about 66.7 atomic percent of the first patterned mask layer.

6. The method according to claim 5,
    wherein the stacked body comprises a plurality of first layers comprising a first material and a plurality of second layers comprising a second material different from the first material, wherein the first layers and the second layers are alternately stacked.

7. The method according to claim 1,
    wherein the first patterned mask layer further comprises a second metal for which a boiling point of a chloride of the second metal is equal to or higher than about 800° C.

8. The method according to claim 1,
    wherein the stacked body comprises a plurality of first layers comprising a first material and a plurality of second layers comprising a second material different from the first material, wherein the first layers and the second layers are alternately stacked.

9. The method according to claim 1, wherein the second mask layer comprises boron and carbon.

10. A method of manufacturing a semiconductor device, the method comprising:
    forming a mask layer comprising aluminum or an aluminum compound on a layer to be etched, the layer to be etched comprising at least one first metal selected from tungsten, hafnium, molybdenum, ruthenium, osmium, and rhenium, wherein the layer to be etched further comprises (i) tungsten and (ii) at least one of boron or carbon;
    patterning the mask layer; and
    etching the layer to be etched by using the patterned mask layer to form a hole or a groove in the layer to be etched.

11. The method according to claim 10, wherein the layer to be etched comprises boron and carbon.

12. A method of manufacturing a semiconductor device, the method comprising:
    forming a mask layer comprising aluminum or an aluminum compound on a layer to be etched, the layer to be etched comprising at least one first metal selected from tungsten, tantalum, zirconium, hafnium, molybdenum, niobium, ruthenium, osmium, rhenium, and iridium;
    patterning the mask layer;
    etching the layer to be etched by using the patterned mask layer to form a hole or a groove in the layer to be etched; and
    disposing a charge storage film, an insulating film and a semiconductor film within the hole or the groove.

13. The method according to claim 12, wherein the layer to be etched comprises tungsten.

14. The method according to claim 12, wherein the patterning the mask layer is carried out using a reactive ion etching method.

15. The method according to claim 12, wherein the semiconductor device to be manufactured comprises a stacked body including a plurality of conductive layers and a plurality of insulating layers that are alternately stacked, wherein the layer to be etched is one of the conductive layers.

16. The method according to claim 15, wherein each of the plurality of conductive layers includes tungsten and each of the plurality of insulating layers includes a silicon oxide film.

* * * * *